(12) United States Patent
Molson

(10) Patent No.: US 9,257,987 B1
(45) Date of Patent: Feb. 9, 2016

(54) PARTIAL RECONFIGURATION USING CONFIGURATION TRANSACTION LAYER PACKETS

(71) Applicant: ALTERA CORPORATION, San Jose, CA (US)

(72) Inventor: Philippe Molson, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/594,927

(22) Filed: Jan. 12, 2015

(51) Int. Cl.
*H03K 19/173* (2006.01)
*H03K 19/177* (2006.01)

(52) U.S. Cl.
CPC .... *H03K 19/17756* (2013.01); *H03K 19/17728* (2013.01)

(58) Field of Classification Search
CPC .............. H03K 19/17728; H03K 19/17736; H03K 19/17756
See application file for complete search history.

(56) References Cited

U.S. PATENT DOCUMENTS

| | | | |
|---|---|---|---|
| 6,976,102 B1 * | 12/2005 | Groen et al. | 710/72 |
| 7,535,254 B1 * | 5/2009 | Case | 326/39 |
| 7,557,607 B1 * | 7/2009 | Tran et al. | 326/39 |
| 8,145,894 B1 * | 3/2012 | Casselman | 713/100 |
| 8,467,218 B1 * | 6/2013 | Atsatt et al. | 365/63 |
| 2008/0028186 A1 * | 1/2008 | Casselman | 712/37 |
| 2010/0058274 A1 * | 3/2010 | Pike et al. | 716/16 |

* cited by examiner

*Primary Examiner* — Jason M Crawford
(74) *Attorney, Agent, or Firm* — Fletcher Yoder, P.C.

(57) ABSTRACT

Systems and methods for implementing partial reconfiguration on an integrated circuit (IC) are provided. During runtime, certain configuration changes may be implemented. The embodiments described herein allow for partial reconfiguration updates to be driven via an independent pathway, reducing complex arbitration, freeing additional application memory resources, and enabling customized partial reconfiguration logic.

20 Claims, 4 Drawing Sheets

PARTIAL RECONFIGURATION USING CONFIGURATION TRANSACTION LAYER PACKETS

BACKGROUND

The present disclosure relates generally to integrated circuits, such as field programmable gate arrays (FPGAs). More particularly, the present disclosure relates to dynamic reconfiguration of logic implemented on integrated circuit (e.g., an FPGA).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuits (ICs) take a variety of forms. For instance, field programmable gate arrays (FPGAs) are integrated circuits that are intended as relatively general-purpose devices. FPGAs may include logic that may be programmed (e.g., configured) after manufacturing to provide any desired functionality that the FPGA is designed to support. Thus, FPGAs contain programmable logic, or logic blocks, that may be configured to perform a variety of functions on the FPGAs, according to a designer's design. Additionally, FPGAs may include input/output (I/O) logic, as well as high-speed communication circuitry. For instance, the high-speed communication circuitry may support various communication protocols and may include high-speed transceiver channels through which the FPGA may transmit serial data to and/or receive serial data from circuitry that is external to the FPGA.

In ICs such as FPGAs, the programmable logic is typically configured using low level programming languages such as VHDL or Verilog. As these programs become more complex and/or sophisticated, the performance of the implementation on the integrated circuit may be negatively impacted. For example, ICs may include partial reconfiguration (PR) blocks, which enable reconfiguration of portions of the ICS logic via received bit streams. These bit streams have traditionally been provided via memory packets (e.g., memory PCIe Transaction Layer Packets (TLPs). Unfortunately, usage of memory packets has resulted in complex arbitration logic that directs application data and partial reconfiguration data. The complex arbitration logic may lead to implementation inefficiencies. Further, using PCIe transaction layer memory packet communications to provide the bit stream data may consume end point base address registers and make excessive memory allocations. Further, mechanisms for transaction layer memory packet communications may be fairly rigid, lacking customizability.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to systems, methods, and devices for enhancing performance of machine-implemented programs through improved transmission of partial reconfiguration bit streams for partial reconfiguration (PR) blocks of an integrated circuit (IC). In particular, in contrast to traditional methods of driving partial reconfiguration via memory PCIe transaction layer packets (memory TLPs), the present embodiments may drive partial reconfiguration using PCIe configuration transaction layer packets (transaction TLPs), resulting in increased customization regarding bit stream functionality, less IC memory consumption, and/or increased efficiency due to reduced main data path arbitration.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present invention alone or in any combination. Again, the brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in further detail below, embodiments of the present disclosure relate generally to circuitry for enhancing performance of machine-readable programs implemented on an integrated circuit (IC). In particular, partial reconfiguration logic may be provided to a partial reconfiguration hub via PCIe configuration TLPs, which may reduce a burden on the PCIe memory TLPs.

Figure 1:
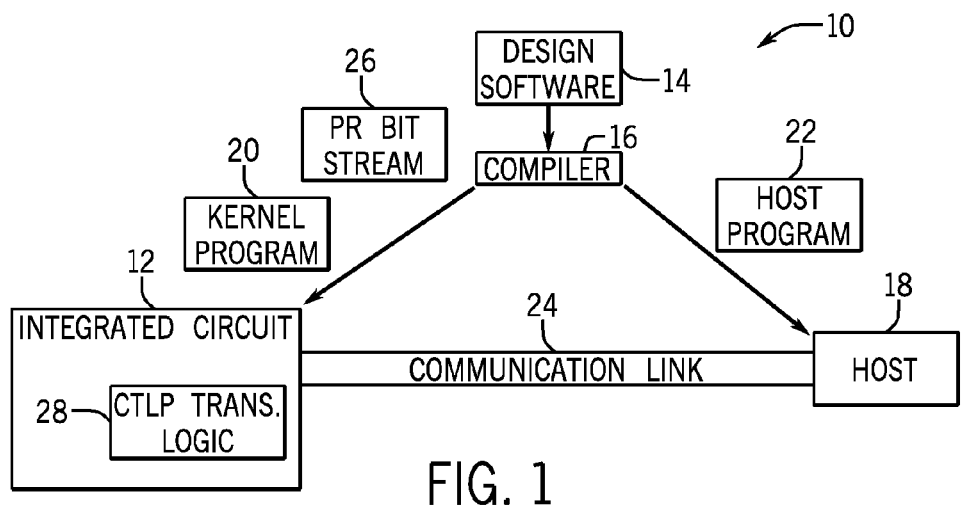
FIG. 1 is a block diagram of a system that utilizes adaptable logic to affect a machine-implemented program, in accordance with an embodiment.

With the foregoing in mind, FIG. 1 illustrates a block diagram of a system 10 that utilizes adaptable logic to affect a machine-implemented program. As discussed above, a designer may desire to implement functionality on an integrated circuit 12 (IC, such as a field programmable gate array (FPGA)). The designer may specify a high level program to be implemented, such as an OpenCL program, which may enable the designer to more efficiently and easily provide programming instructions to implement a set of programmable logic for the IC 12 without requiring specific knowledge of low level computer programming languages (e.g., Verilog or VHDL). For example, because OpenCL is quite similar to other high level programming languages, such as C++, designers of programmable logic familiar with such programming languages may have a reduced learning curve than designers that are required to learn unfamiliar low level programming languages to implement new functionalities in the IC.

The designers may implement their high level designs using design software 14, such as a version of Quartus by Altera™. The design software 14 may use a compiler 16 to convert the high level program into a low level program. The compiler 16 may provide machine-readable instructions representative of the high level program to a host 18 and the IC 12. For example, the IC 12 may receive one or more kernel programs 20 which describe the hardware implementations that should be stored in the IC. The host 18 may receive a host program 22 which may be implemented by the kernel programs 20. To implement the host program 22, the host 18 may communicate instructions from the host program 22 to the IC 12 via a communications link 24, which may be, for example, direct memory access (DMA) communications or peripheral component interconnect express (PCIe) communications.

In some embodiments, partial reconfiguration may be activated (e.g., via the design software 14). Partial reconfiguration enables one or more portions of the IC to be modified while other parts of the IC 12 are still in operation. To affect these changes, a partial reconfiguration bit stream 26 may be provided to the IC 12 during the operation of the IC 12. The bit stream defines modifications to the hardware implementation on the IC 12.

As will be discussed in more detail below, PCIe configuration TPL (CTLP) transmission logic 28 may be used to drive partial reconfiguration in the IC 12. In some embodiments, the CTLP transmission logic 28 may provide a dedicated data transmission pathway for the PR bit stream 26.

Figure 2:
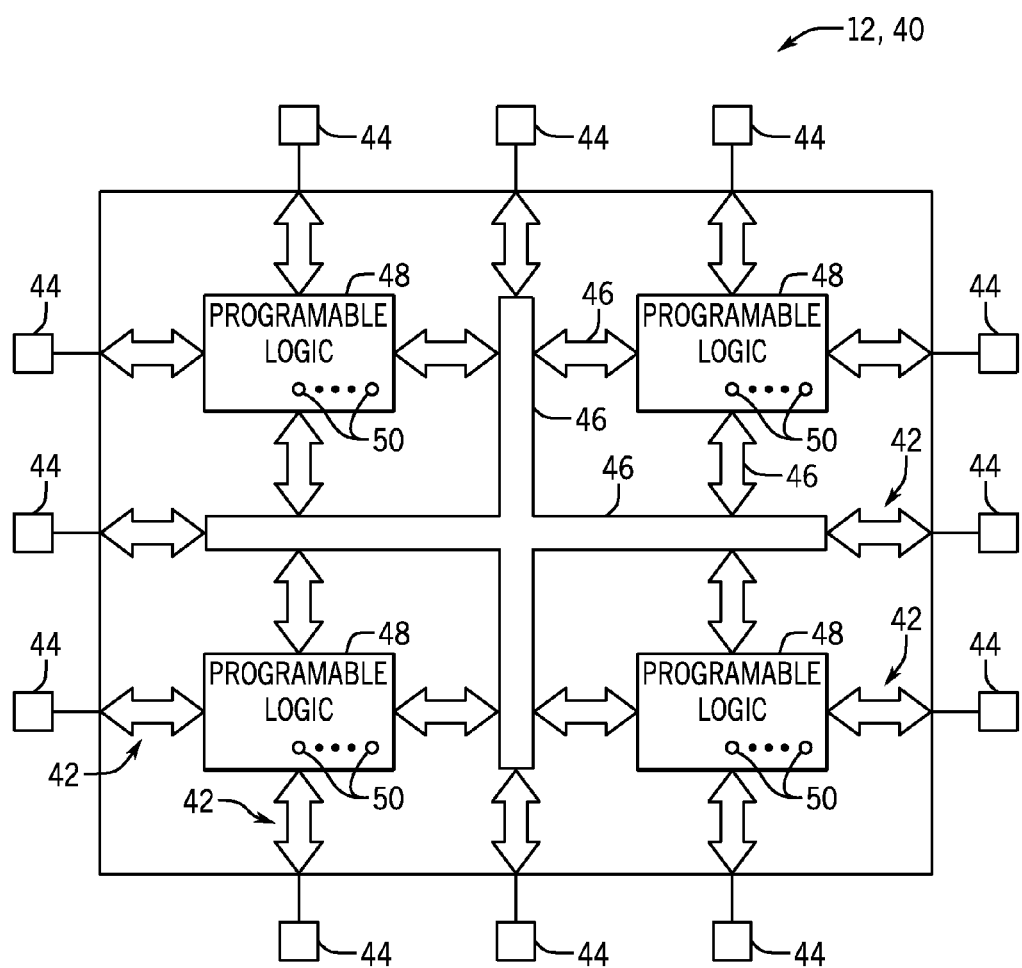
FIG. 2 is a block diagram of a programmable logic device that may include logic useful for implementing the adaptable logic, in accordance with an embodiment.

Turning now to a more detailed discussion of the IC 12, FIG. 2 illustrates an IC device 12, which may be a programmable logic device, such as a field programmable gate array (FPGA) 40. For the purposes of this example, the device 40 is referred to as an FPGA, though it should be understood that the device may be any type of programmable logic device (e.g., an application-specific integrated circuit and/or application-specific standard product). As shown, FPGA 40 may have input/output circuitry 42 for driving signals off of device 40 and for receiving signals from other devices via input/output pins 44. Interconnection resources 46, such as global and local vertical and horizontal conductive lines and buses, may be used to route signals on device 40. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48.

Programmable logic devices, such as FPGA 40, may contain programmable elements 50 with the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

Most programmable logic devices are electrically programmed. With electrical programming arrangements, the programmable elements 50 may be formed from one or more memory cells. For example, during programming, configuration data is loaded into the memory cells 50 using pins 44 and input/output circuitry 42. In one embodiment, the memory cells 50 may be implemented as random-access-memory (RAM) cells. The use of memory cells 50 based on RAM technology is described herein is intended to be only one example. Further, because these RAM cells are loaded with configuration data during programming, they are sometimes referred to as configuration RAM cells (CRAM). These memory cells 50 may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

The circuitry of FPGA 40 may be organized using any suitable architecture. As an example, the logic of FPGA 40 may be organized in a series of rows and columns of larger programmable logic regions, each of which may contain multiple smaller logic regions. The logic resources of FPGA 40 may be interconnected by interconnection resources 46 such as associated vertical and horizontal conductors. For example, in some embodiments, these conductors may include global conductive lines that span substantially all of FPGA 40, fractional lines such as half-lines or quarter lines that span part of device 40, staggered lines of a particular length (e.g., sufficient to interconnect several logic areas), smaller local lines, or any other suitable interconnection resource arrangement. Moreover, in further embodiments, the logic of FPGA 40 may be arranged in more levels or layers in which multiple large regions are interconnected to form still larger portions of logic. Still further, other device arrangements may use logic that is not arranged in a manner other than rows and columns.

Figure 3:
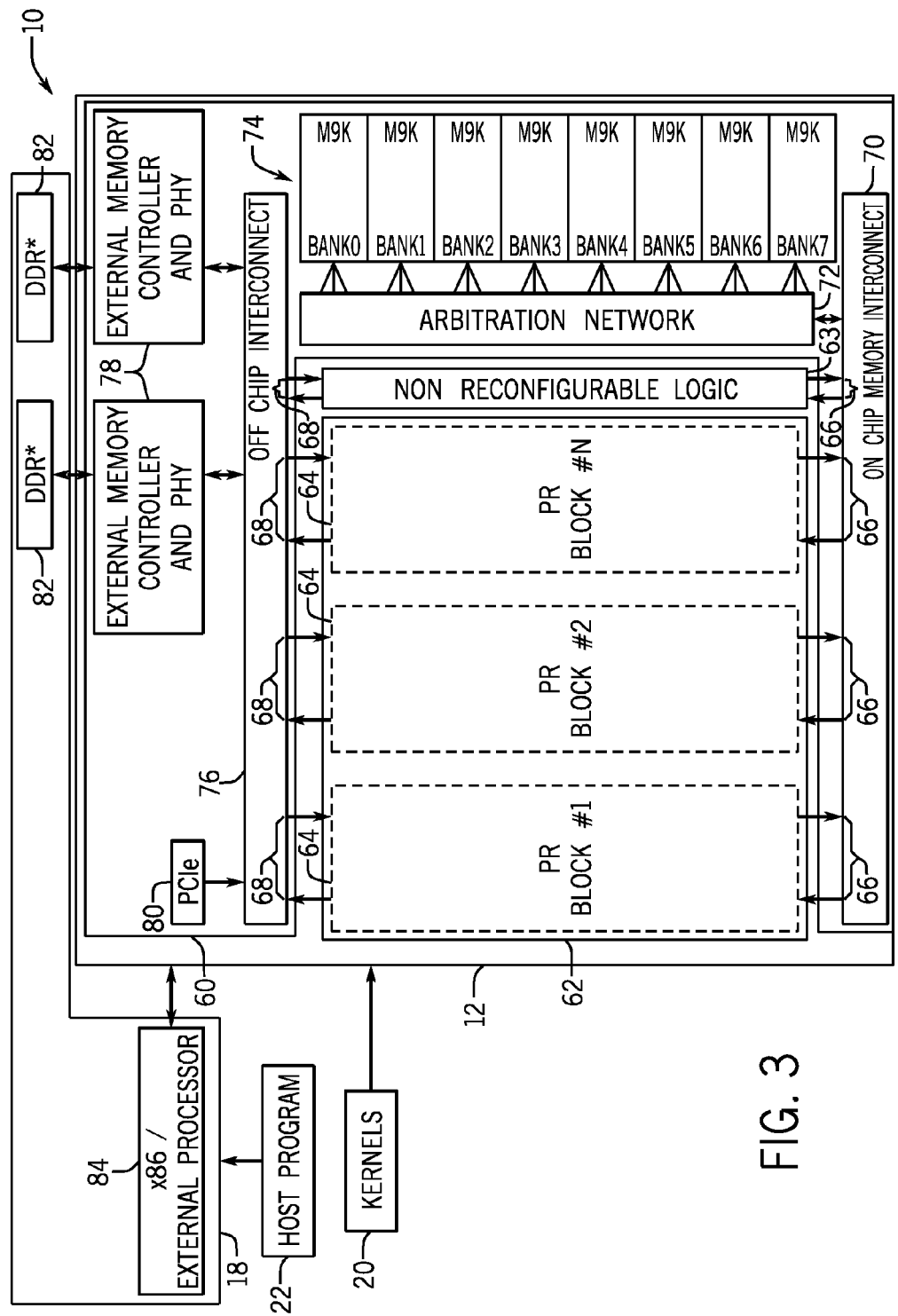
FIG. 3 is a block diagram illustrating elements of the host and integrated circuit of FIG. 1, in accordance with an embodiment.

As discussed in further detail below, the FPGA 40 may include areas of programmable logic 48 where partial reconfiguration of the FPGA 40 may take place. As mentioned above, partial reconfiguration allows for the reconfiguration of a portion of the programmable logic 48. The logic to be reconfigured is dictated by a received partial reconfiguration bit stream (e.g., PR bit stream 26 of FIG. 1). As will be discussed in more detail below, upon reception of the bit stream by a PR hub of the IC 12, the PR hub may alter the configuration of the programmable logic 48. bit stream may cause a change in one or more of the programmable interconnects, etc., which may alter the configuration of the IC 12. In some embodiments, the bit stream may Referring now to FIG. 3, a block diagram illustrating the system 10, further detailing elements of the host 18 and IC 12 of FIG. 1 is provided. As illustrated, the IC 12 may include fixed components 60 and configurable components 62.

The configurable components 62 may include non-reconfigurable soft logic 63. Further, some ICs, such as a Stratix® V or Arria 10® FPGA by Altera®, provide partial reconfiguration capabilities. For example, in some embodiments, the configurable components may include a number (N) of partial reconfiguration (PR) blocks 64 stored on an IC 12 (such as FPGA 40 of FIG. 2). The PR blocks 64 may prove an ability to reconfigure part of the IC 12 while the rest of the device continues to work. The PR blocks 64 may include ports to both on-chip memory interconnects and off-chip interconnects (ports 66 and 68, respectively). The PR blocks 64 are not restricted to a particular protocol, however, each of the PR blocks 64 within an IC 12 may agree on a common protocol. For example, each of the PR blocks 64 may use the Avalon® Memory-Mapped (Avalon-MM) interface, which may allow easy interconnect between components in the IC 12. The size and number of PR blocks 64 may be defined by the hardware implementations and amount of programmable logic available on the IC 12.

Turning now to a discussion of the fixed logic 60, the fixed logic 60 may include an on-chip memory interconnect 70, an arbitration network 72, local memory 74, an off-chip interconnect 76, external memory and physical layer controllers 78, and/or a PCIe bus 80. The on-chip memory interconnect 70 may connect to the PR blocks 64 over the on-chip memory interconnect ports 66 of the PR blocks 64. The on-chip memory interconnect 70 may facilitate access between the PR blocks 64 and the local memory 74 via the arbitration network 72. Further, the off-chip memory interconnect 76 may connect to the PR blocks 64 over the off-chip memory interconnect ports 68 of the PR blocks 64. The off-chip interconnect 76 may facilitate communications between the PR blocks 64 and the host communications components (e.g., the external memory and physical layer controllers 78 and the PCIe bus 80). The external memory and physical layer controllers 78 may facilitate access between the IC 12 and external memory (e.g., host 18 memory 82). Further the PCIe bus 80 may facilitate communication between the IC 12 and an external processor (e.g., host 12 processor 84).

As mentioned above, in cases where bit streams are provided via memory TLPs, complex arbitration may be necessary (e.g., via the arbitration network 72). This may be due to the sharing of resources (e.g., local memory 74) between the PR bit stream and other applications of the IC 12. Accordingly, current embodiments utilize PCIe configuration TLP mechanisms for partial reconfiguration data (e.g., data that causes configuration changes to the PR blocks 54) and memory TPL mechanisms for non-reconfigurable data (e.g., data associated with non-reconfigurable logic 63). This may result in increased implementation efficiencies and other advantages.

Figure 4:
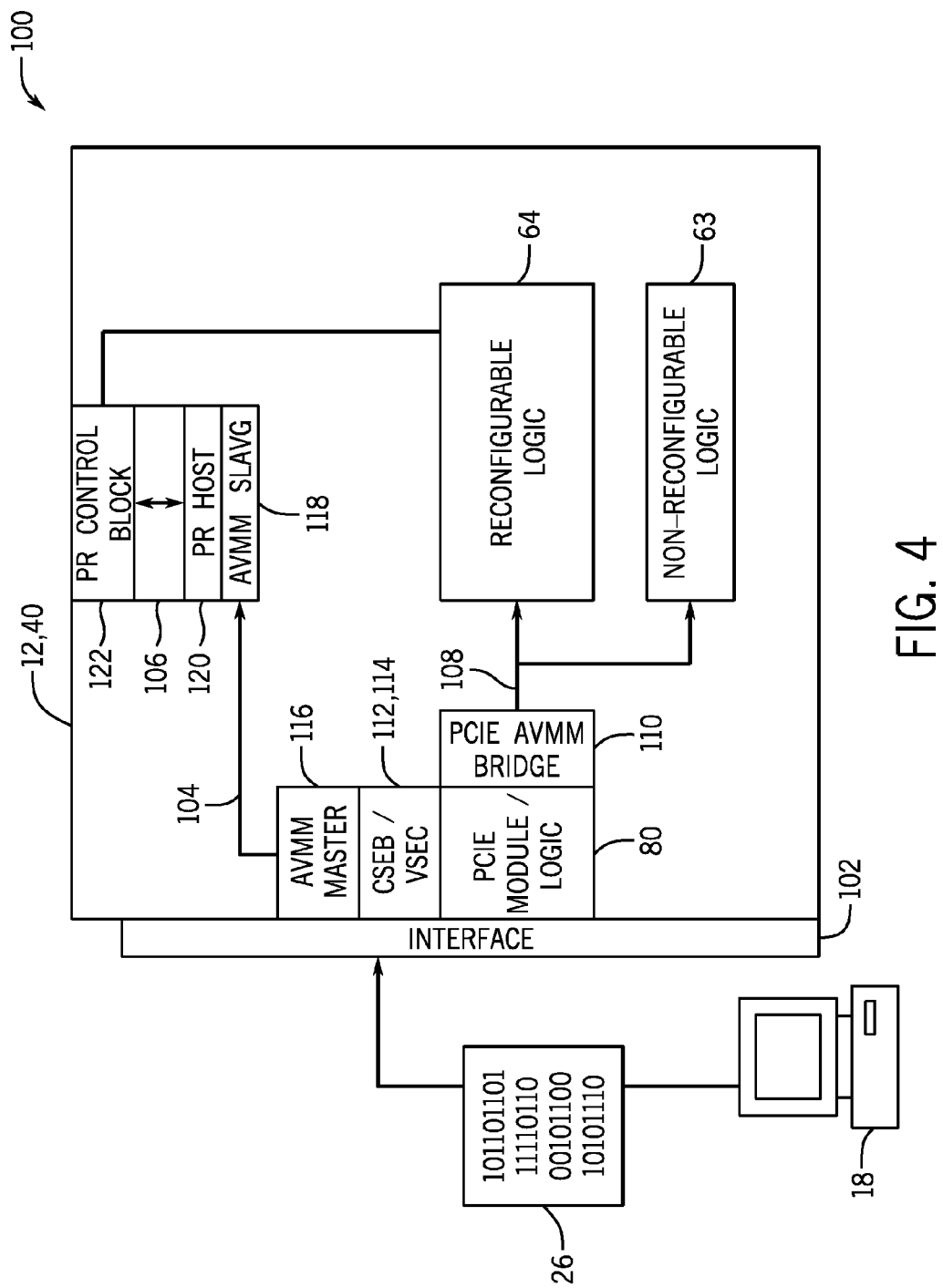
FIG. 4 is a block diagram illustrating a partial reconfiguration hub driven by configuration packets, in accordance with an embodiment.

FIG. 4 is a block diagram illustrating a system 100 where an IC 12 (e.g., an FPGA 40) with a partial reconfiguration hub is driven by configuration packets, in accordance with an embodiment. As previously discussed, partial reconfiguration is driven by a PR bit stream 26 that is provided to the IC 12 (e.g., via a host 18 and/or design software 14 of FIG. 1). The PR bit stream 26 may be provided via an interface 102 that communicatively couples the PR bit stream 26 source (e.g., host 18) with the IC 12 (e.g., FPGA 40).

A PCIe bus 80 of the IC 12 may be used to route data through a first pathway 104 to a partial reconfiguration hub 106 and/or a second pathway 108 to read/write to memory of the IC 12 via functionality that does not invoke partial reconfiguration (e.g., an initial implementation of reconfigurable logic 64 and/or implementation of non-reconfigurable logic 63). The PCIe bus 80 may utilize a memory interface (e.g., the Avalon® Memory-Mapped (Avalon-MM) interface 110) to invoke such operations.

As mentioned above, utilizing a separate pathway (e.g., pathway 104) for driving partial reconfiguration (e.g., providing the PR bit stream 26 to the PR hub 106) may result in implementation efficiencies. For example, as will be discussed in more detail below, by utilizing pathway 104 to drive the partial reconfiguration hub 106, less transfer arbitration may be necessary. Further, because the PR bit stream 26 is transferred via the pathway 104, the transfer does not require the consumption of endpoint base address registers (BARs), which may be freed up for functionality other than partial reconfiguration. Additionally, by using an independent pathway (e.g., pathway 104), customized bit stream operations may be implemented.

To drive partial reconfiguration via the second pathway 104, a configuration shadow/extension bus (CSEB) 112 that may be used to implement custom extensions on the IC 12. For example, in current embodiments, the CSEB 112 of the IC 12 may be used to implement a vender specific extended capability (VSEC) structure 114. The VSEC structure 114 includes data useful for transporting the PR bit stream 26 to the PR hub 106 and implement a process for updating the PR logic (e.g., reconfigurable logic 64), as will be discussed in more detail with regard to FIG. 5.

The VSEC structure 114 may be customized to include additional functionalities related to partial reconfiguration. For example, the VSEC structure 114 may be customized to include custom bit stream encryption, compression, and/or error correction. Further the VSEC structure 114 may be modified to facilitate customized partial reconfiguration error checking and/or customized repair of defective IC 12 sectors.

Further, the CSEB 112 includes a memory-mapped master (e.g., an Avalon® Memory-Mapped (Avalon-MM) master 116) to drive the PR hub 106, which includes a corresponding memory-mapped slave (e.g., am Avalon® Memory-Mapped (Avalon-MM) slave 118). The slave 118, based upon instructions from the master 116, provides data to the PR host 120, which provides PR requests to a PR control block 122 that may verify and/or process the PR requests.

Figure 5:
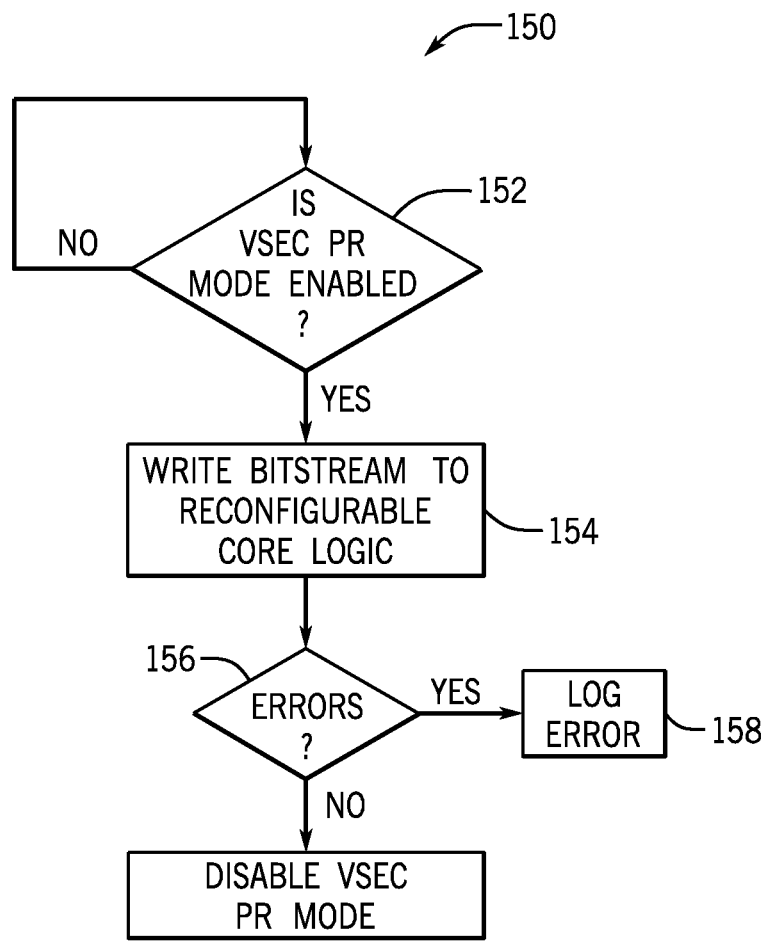
FIG. 5 is a flow chart illustrating a process used to drive a partial reconfiguration hub via configuration packets, in accordance with an embodiment.

Turning now to a more detailed discussion regarding the partial reconfiguration implementation via the PR hub 106, FIG. 5 is a flow chart illustrating a process 150 of driving the partial reconfiguration hub (e.g., hub 106 of FIG. 4) via configuration packets (e.g., packets sent via the CSEB 112/VSEC structure 114 of FIG. 4), in accordance with an embodiment.

The process 150 begins by determining whether partial reconfiguration via the VSEC structure is enabled (decision block 152). For example, a status register may be read to determine if a bit indicating that PR via the VSEC structure is enabled has been set. If it is determined that PR via the VSEC structure has not be enabled (e.g., the bit indicating that PR via the VSEC structure is enabled is not set) bit indication, the system continues to monitor for such an indication.

However, when it is determined that PR via the VSEC structure is enabled (e.g., the indication bit is set), data is written to the reconfigurable core logic based upon the PR bit stream (block 154). For example, in some embodiments, the IC 12 may be initialed to accept transfer data for inclusion in the reconfigurable core logic, may set a transfer flag bit to "1" to indicate that the transfer has been enabled, and may write the transfer data to the reconfigurable core logic. During and/or upon competition of this process, error detection may occur (decision block 156).

If errors are detected, they may be logged (e.g., in an error log file) for subsequent retrieval and/or troubleshooting (block 158. If the transfer is successful (e.g., no errors are detected during the transfer), the PR via VSEC is disabled. For example, in some embodiments, the transfer flag bit is set to "0", indicating that that transfer is complete.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. An integrated circuit (IC) device comprising:
   at least one partial reconfiguration (PR) block comprising a physical location on the IC that can be reconfigured during runtime of the IC;
   a peripheral component interconnect express (PCIe) bus configured to facilitate updates to the PR block, by:
      transferring partial reconfiguration data via a first data pathway, wherein the first data pathway comprises a data pathway to transport PCIe configuration transaction layer packets (CTLPs); and
      transferring non-partial reconfiguration data via a second data pathway that is independent from the first data pathway.

2. The IC device of claim 1, comprising an interface configured to communicatively couple the IC device with a host computer that provides the partial reconfiguration data.

3. The IC device of claim 1, comprising a common protocol used to transfer the partial reconfiguration data via the first data pathway.

4. The IC device of claim 3, wherein the common protocol comprises an Avalon Memory Mapped Interface (Avalon-MM).

5. The IC device of claim 1, comprising a configuration shadow/extension bus (CSEB) used to facilitate transfer of the partial reconfiguration data via the first data pathway.

6. The IC device of claim 5, comprising a vendor-specific extended capability (VSEC) structure defined using the CSEB, wherein the VSEC structure comprises information useful for transferring the partial reconfiguration data via the first data pathway.

7. The IC device of claim 5, wherein the CSEB comprises a memory-mapped master for facilitating updates to the at least one PR block.

8. The IC device of claim 7, where the memory-mapped master comprises an Avalon memory-mapped master.

9. The IC device of claim 5, wherein the PR hub comprises:
   an Avalon memory-mapped slave configured to be controlled using a master of the CSEB via the first data pathway;
   a PR host that receives partial reconfiguration requests from the Avalon memory-mapped slave; and
   a PR control block configured to: receive the partial reconfiguration requests from the PR host; and verify, process, or verify and process the partial reconfiguration requests on the at least one PR block.

10. The IC device of claim 1, comprising a PR hub configured to control update operations of the at least one PR block, wherein the PR hub is communicatively coupled with the PCIe bus via the first data pathway.

11. A tangible, non-transitory, computer-readable medium, comprising instructions to:
    receive, via a peripheral component interconnect express (PCIe) bus, a partial reconfiguration (PR) bit stream, wherein the PR bit stream defines one or more updates to at least one PR block of an IC, the at least one PR block comprising a physical location on the IC that can be reconfigured during runtime of the IC;
    receive, via the PCIe bus, non-PR data to be transferred to a location within the IC;
    transfer, via a first data pathway, the PR bit stream to a PR hub of the IC, wherein the first data pathway comprises a data pathway to transport PCIe configuration transaction layer packets (CTLPs); and
    transfer, via a second data pathway that is independent from the first data pathway, the non-PR data to the location.

12. The computer-readable medium of claim 11, comprising instructions to drive the PR hub via the first data pathway, using an Avalon memory-mapped interface.

13. The computer-readable medium of claim 11, comprising: one or more customized partial reconfiguration functionalities, the one or more customized partial reconfiguration functionalities comprising: bit stream encryption, bit stream compression, bit stream error correction, customized repair of defective IC sectors, customized partial reconfiguration monitoring, or any combination thereof.

14. The computer-readable medium of claim 11, wherein the instructions are defined using a configuration shadow/extension bus feature of the IC.

15. The computer-readable medium of claim 11, wherein the instructions comprise a vender-specific extended capability structure.

16. The computer-readable medium of claim 11, comprising instructions to receive the PR bit stream via an interface communicatively coupling the IC with a host.

17. The computer-readable medium of claim 11, where in the interface comprises a high-speed serial interface.

18. A computer-implemented method, comprising:
    updating a physical location on the IC during runtime of an integrated circuit (IC), by:
       transferring partial reconfiguration data via a first data pathway, wherein the first data pathway comprises a data pathway to transport PCIe configuration transaction layer packets (CTLPs); and
       transferring non-partial reconfiguration data via a second data pathway that is independent from the first data pathway.

19. The computer-implemented method of claim 18, comprising:
    transferring the partial reconfiguration data using a vendor-specific extension capability (VSEC) structure that is defined using a configuration shadow/extension bus (CSEB) feature of the IC;
    wherein the VSEC structure comprises information useful for transporting the partial reconfiguration data.

20. The computer-implemented method of claim 18, wherein the first data pathway is a pathway configured to transfer configuration data packets and wherein the second data pathway is a pathway configured to transfer application data packets.

* * * * *